FLUID AMPLIFIER COMPENSATION NETWORK

Filed Sept. 23, 1964

INVENTOR.
WILLIS A. BOOTHE
BY Gerald L Moore
ATTORNEY

United States Patent Office 3,451,410

Patented June 24, 1969

3,451,410

FLUID AMPLIFIER COMPENSATION NETWORK

Willis Anson Boothe, Scotia, N.Y., assignor to General Electric Company, a corporation of New York Filed Sept. 23, 1964, Ser. No. 398,607
Int. Cl. F15c *1/08, 1/12, 1/14*
U.S. Cl. 137—81.5 4 Claims This invention relates to a fluid amplifier compensation network, and more specifically to a fluid amplifier network which utilizes an input signal to generate an amplified output signal and additionally supply a delayed high gain proportional output for a reset signal to eliminate, or at least minimize, droop in the control system to produce a proportional plus reset control well known in the process control art.

Figure 1:
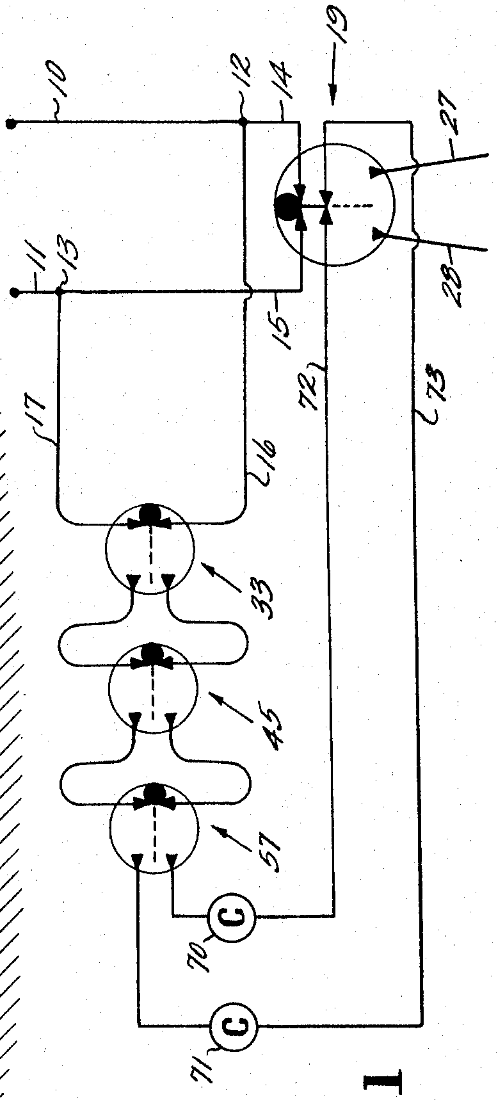

In control systems and specifically in turbojet engine controls, it is frequently necessary to compensate for droop in the control system. Such droop of a control system results as the system is loaded and the control mechanism signals for more motive fluid input. The control mechanism attempts to maintain a required speed output and calls for more motive fluid input on a reduction in speed, therefore there must be some speed reduction to cause the control to require more motive fluid input. As a result there is some difference between the required speed and the actual speed as the system is loaded and this is referred to as droop.

The subject invention is directed toward compensating for this droop by providing a fluid amplifier which immediately provides a proportional signal output responsive to the input signal and also proportional to a reset signal which adds to or increases the output signal to compensate for the control droop. The result is a system having a high steady state accuracy due to the high steady state gain.

Stability of this and other systems is achieved by having lower dynamic gain at frequencies to which only the proportional part of the circuit is responsive. Due to the nature of the reset signal the output signal will not respond to rapidly changing or higher frequency input signals by increasing and desirably may decrease.

It is therefore an object of this invention to provide a fluid amplifier network comprising a power or summing amplifier having two control signal inputs, one of which is directly responsive to the input control signal and the second of which is responsive to the input control signal being passed through a long time constant or integrating network.

It is another object of this invention to provide a fluid amplifier network comprising a power amplifier having two control signal inputs, one of which is responsive directly to the input control signal and the second of which is responsive to a control signal effected by passing the original control signal through cascaded fluid amplifiers and a long time constant reactance.

In accordance with one embodiment of the invention, there is provided a power amplifier having a pair of control signal inputs one of which receives the initial control signal directly and the second of which receives the control signal after it has been passed through a series of cascaded fluid amplifiers and a reactance which together comprise a long time constant integrating network, such that the power amplifier reacts to the immediate changes in the control signal and additionally provides an approximate reset function by reacting after a time period to provide a reset signal proportional to the long term changes in the input signal.

Figure 2:
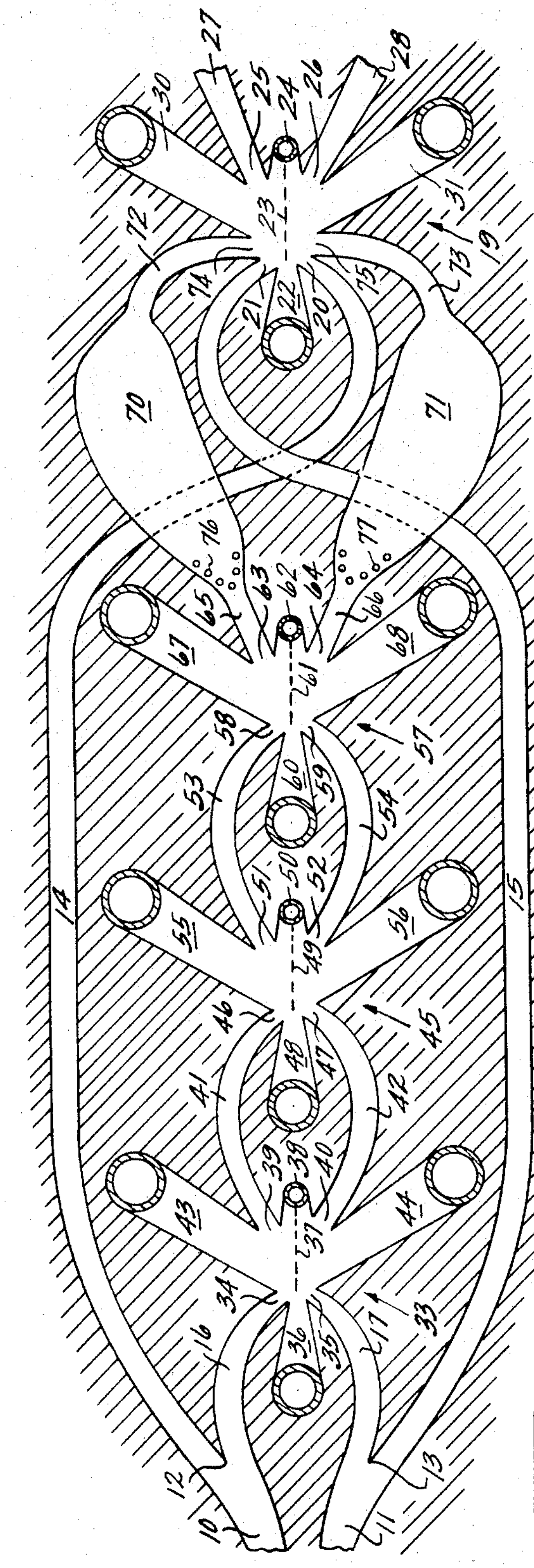

Other objects and many of the attendant advantages of this invention will be readily appreciated as the same becomes better understood by reference to the following detailed description when considered in connection with the accompanying drawings wherein:

FIG. 1 illustrates schematically the subject invention comprising a power amplifier having two control signal inputs, and FIG. 2 illustrates in cross-section one embodiment of the fluid amplifier network of FIG. 1.

Referring now to the drawings there is illustrated a fluid amplifier network comprising conduit means 10 and 11 for transmitting a control signal input in the form of a fluid flow of equal or unequal pressures to junctures 12 and 13 respectively where the control signal is split to pass either through conduits 14 and 16 or 15 and 17. The control signal in passing through either of the conduits 14 and 15 passes through the control signal ports 20 and 21 of a power fluid amplifier 19 which includes a power nozzle 22 through which a pressured fluid stream is applied, preferably under constant pressure, forming a power jet which normally issues as indicated along the dotted line 23 to impinge into the cusp 24 which is vented to atmosphere or in some manner returns the fluid to the fluid system if desired. On either side of the cusp 24 are located receivers 25 and 26 providing the amplified control signal output from the fluid amplifier 19 through the output conduits 27 and 28. Fluid entering through either of the control ports 20 or 21 will deflect the power jet into the receivers 25 and 26 respectively, responsive proportionally to the force of the control signal input and thereby providing a control signal amplification in the normal manner of proportional fluid amplifiers. Vents 30 and 31 are also provided to drain off any excess fluid which does not pass into the cusp 24 or the receivers 25 and 26.

To provide the reset signal a portion of the control signal flow from the conduits 10 and 11 also passes through the conduit 16 or 17 to the control signal ports 34 and 35 of the fluid amplifier 33. Fluid amplifier 33 includes the power jet nozzle 36 which emits a power jet 37 and includes the cusp 38 vented to atmosphere and receiver ports 39 and 40 connected with output conduits 41 and 42. This fluid amplifier also includes vents 43 and 44 functioning as the other vents previously described.

Conduits 41 and 42 lead from fluid amplifier 33 to the control signal ports 46 and 47 of fluid amplifier 45 which also includes power jet nozzle 48 emitting a power jet 49, and further includes a cusp 50, receiver ports 51 and 52 connected to conduits 53 and 54, and vents 55 and 56. Output conduits 53 and 54 lead to control signal ports 58 and 59 of fluid amplifier 57 which includes a power jet nozzle 60 emitting a power jet 61, with the fluid amplifier including a cusp 62 and receiver ports 63 and 64 connected with conduits 65 and 66. This fluid amplifier also includes vents 67 and 68 for the purpose previously described. Connecting with conduits 65 and 66 are fluid reactances, in this embodiment fluid capacitors 70 and 71, which in turn connect with conduits 72 and 73 leading to the control nozzles 74 and 75 of the fluid amplifier 19. While the capacitors are shown as simple volumes these could be expanding type accumulators if a noncompressible fluid were utilized. These capacitors include posts 76 and 77 which break up a direct flow through the capacitors and assure that the volume will be substantially filled prior to flow passing into the conduits 72 and 73; otherwise direct flow could result from the fluid adhering to the walls of the capacitor and passing directly through the capacitor in this manner prior without the volume being filled.

In operation the fluid amplifier network receives control signals through the conduits 10 and 11, a portion of which passes through conduits 14 and 15 and control nozzles 20 and 21 immediately deflect the power jet 23. For purposes of this explanation assume that the control signal flow through conduit 10 is suddenly changed to a greater pressure than that through conduit 11. With the increased flow through conduit 14 the flow passing through the control signal nozzle 20 will deflect the power nozzle 23 towards receiver 25 thereby increasing the flow through the conduit 27. In this manner an immediate proportional signal is passed through the conduit 27 greater than and proportional to the initial control signal received through conduit 10 in the normal operating manner of a fluid amplifier.

When increased pressure is received from conduit 10 at juncture 12 a portion of the flow passes through conduit 16 to the fluid amplifier 33 to deflect the power jet 37 towards receiver 40. This deflection increases flow through conduit 42 which deflects power jet 49 towards receiver 51. A resulting increased flow through conduit 53 results in an increased signal flow through control signal nozzle 58 to deflect the power jet 61 towards the receiver 64 increasing flow through the conduit 66.

The control signal, in passing through the cascaded fluid amplifiers 33, 45 and 57 has thereby been amplified proportionally to the original control signal input through conduit 10. As a result, with a unidirectional change in the central signal, the pressure in fluid capacitor 71 will rise at a rate proportional to this signal due to the filling action of volume until a new equilibrium is reached. The increased pressure in volume 71 produces an added flow through conduit 73 and a resulting progressive increase in flow through the control signal port 75 to aid in deflecting the power jet 23 towards receiver 25. The effect is that of a long time constant lag network which approximates that of a true integrator.

Due to the long time constant of this network this control signal input to ports 74 and 75 lags the control signal input to ports 20 and 21 of amplifier 19 to comprise a reset signal serving an integrating function for the overall control. In this manner there is provided a fluid amplifier network supplying an immediate amplified signal proportional to the original control signal input to the power amplifier with an additive integrated signal provided over a time that approximates the integral of changes in the control signal.

For bidirectional input signal changes at a relatively low rate the integrating function is lost but the reset signal continues to provide an amplifying input to the amplifier 19 which functions as a summing device. For rapidly changing signals, volume 71 tends to attenuate the signal before it reaches amplifier 19, the attenuation being greater as the rate of bidirectional change, i.e., increase and decrease, of the signal becomes greater. The result is that with rapid bidirectional changes in the input signal, the recovered pressure in output conduits 27 and 28 has the same rate of variation as the input signal and is increased or amplified to a progressively lesser extent as frequency is increased and the reset signal is attenuated in the volumes 70 and 71.

As explained heretofore, one use for such a fluid amplifier network is to reset a control system and while there has been described one means for delaying and integrating the control signal input through the cascaded fluid amplifier other means exist, for instance fluid inductors consisting of long passages instead of fluid capacitors could be utilized in such a network. Also where cascaded fluid amplifiers are utilized any number of amplifiers could be used to meet the specific need, as long as due attention is given to signal polarity.

What is claimed as new and desired to be secured by Letters Patent of the United States is:

1. A fluid amplifier network, for amplifying an input signal to provide an output signal of increased strength, comprising, means, including a delay fluid flow path, for providing a reset signal which, with unidirectional changes in input strength provides a reset signal proportionately varying over a given time period at a rate proportionate to the strength of the input signal and, which, with relatively rapid bidirectional variations in input signal strength provides a reset signal of progressively decreasing strength as the rate of bidirectional variation of the input signal increases, and summing fluid amplifier means responsive to both the input signal and the reset signal and providing, for unidirectional input signal changes, an output signal immediately varied in strength proportionate to the input signal and also proportionate to the progressively varying strength of the reset signal and providing for reltaively rapidly changing, bidirectional input signals, an output signal which decreases in strength as the rate of variation in the input signal increases.

2. A fluid amplifier network as in claim 1 wherein, the summing fluid amplifier means include an output power stream deflected in a given direction to change (increase or decrease) the output signal strength in response to a change in either the input or reset signal in a given direction (increase or decrease).

3. A fluid amplifier network as in claim 11 further including, means for amplifying the reset signal.

4. A fluid amplifier network as in claim 3 wherein, the reset signal means comprise a plurality of fluid amplifiers connected in series, and the delay fluid flow path comprises a volume interposed between the last of said series of fluid amplifiers and the summing fluid amplifier means.

References Cited

UNITED STATES PATENTS

| | | | |
|---|---|---|---|
| 3,155,825 | 11/1964 | Boothe | 137—81.5 |
| 3,238,959 | 3/1966 | Bowles | 137—81.5 |
| 3,266,510 | 8/1966 | Wadey | 137—81.5 |

M. CARY NELSON, *Primary Examiner.*

W. R. CLINE, *Assistant Examiner.*